United States Patent
Ito et al.

(10) Patent No.: US 6,617,607 B2
(45) Date of Patent: Sep. 9, 2003

(54) NITRIDE SEMICONDUCTOR LASER DEVICE AND OPTICAL PICKUP APPARATUS THEREWITH

(75) Inventors: Shigetoshi Ito, Nara (JP); Yuhzoh Tsuda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/842,447

(22) Filed: Apr. 26, 2001

(65) Prior Publication Data

US 2001/0035532 A1 Nov. 1, 2001

(30) Foreign Application Priority Data

Apr. 27, 2000 (JP) ........................................ 2000-126908

(51) Int. Cl.[7] ................. H01L 31/0328; H01L 31/0336; H01L 31/072; H01L 31/109
(52) U.S. Cl. ............................. 257/22; 257/13; 257/14; 257/17; 257/21; 257/23; 257/79; 257/82; 257/94; 257/98; 257/101; 257/102; 257/184
(58) Field of Search ................................ 257/103, 101, 257/102, 98, 179, 82, 13, 14, 17, 21, 22, 23, 184, 94

(56) References Cited

U.S. PATENT DOCUMENTS

| | | | | |
|---|---|---|---|---|
| 5,714,772 A | * | 2/1998 | Fang et al. | 257/82 |
| 5,739,554 A | * | 4/1998 | Edmond et al. | 257/103 |
| 6,172,382 B1 | * | 1/2001 | Nagahama et al. | 257/94 |
| 6,232,623 B1 | * | 5/2001 | Morita | 257/103 |
| 6,329,667 B1 | * | 12/2001 | Ota et al. | 257/13 |
| 2002/0048302 A1 | * | 4/2002 | Kimura | 372/46 |
| 2002/0056836 A1 | * | 5/2002 | Sawazaki et al. | 257/13 |
| 2002/0084452 A1 | * | 7/2002 | Ota et al. | 257/13 |
| 2002/0085603 A1 | * | 7/2002 | Okumura | 372/45 |

FOREIGN PATENT DOCUMENTS

JP 11-214788 1/1998

OTHER PUBLICATIONS

*Room–Temperature Continuous–Wave Operation of InGaN Multi–Quantum–Well Laser Diodes Grown on an n–GaN Substrate with a Backside n–Contact*, Kuramoto M. et al., Jpn. J. Appl. Phys., vol. 38, pp L184–186, 1999.
"*InGaN/GaN/AlGaN–Based Laser Diodes Grown on GaN Substrates with a Fundamental Transverse Mode*," Nakamura S. et al., Jpn. J. Appl. Pys., vol. 37, pp L1020–L1022, 1998.

* cited by examiner

Primary Examiner—Amir Zarabian
Assistant Examiner—Ida M. Soward
(74) Attorney, Agent, or Firm—Morrison & Foerster LLP

(57) ABSTRACT

A nitride semiconductor laser device includes a nitride semiconductor substrate, and a layered portion corresponding to a nitride semiconductor film grown on the nitride semiconductor substrate, the layered portion including an n-type layer and a p-type layer and a light emitting layer posed between the n- and p-type layers, of the n- and p-type layers a layer opposite to the nitride semiconductor substrate with the light emitting layer opposed therebetween serving as an upper layer having a stripe of 1.9 $\mu$m to 3.0 $\mu$m in width, the light emitting layer and the upper layer having an interface distant from a bottom of the stripe by 0 $\mu$m to 0.2 $\mu$m.

14 Claims, 8 Drawing Sheets

<1-100> AZIMUTH

<1-100>AZIMUTH

<11-20>AZIMUTH

NITRIDE SEMICONDUCTOR LASER DEVICE AND OPTICAL PICKUP APPARATUS THEREWITH

BACKGROUND OF THE INVENTION

1. Field of the Invention

The present invention relates to nitride semiconductor laser devices having a lasing threshold value corresponding to a low current value, and having an extended longevity, and semiconductor laser apparatus therewith.

2. Description of the Background Art

Jpn. J. Appl. Phys. Vol. 38 (1999) pp. L184–186 reports a nitride semiconductor laser having a GaN substrate with crystal growth thereon. The GaN substrate was prepared using the facet-initiated epitaxial lateral overgrowth (FIELO) technique and the nitride semiconductor laser device had a ridge-geometric stripe with a width of 3 $\mu$m. The document does not refer to the thickness of a residual film of the ridge-geometric stripe.

While the GaN substrate had a crystal defect density smaller for example than a conventional sapphire substrate, the device had a lasing threshold value corresponding to a high current value of 144 mA (with a threshold current density of 10.9 kA/cm$^2$). The present inventors conducted an experiment, which has revealed that the high current value corresponding to the lasing threshold is attributed to the fact that the ridge-geometric stripe had an inappropriate width W and a residual film of the ridge-geometric stripe had an inappropriate thickness d. Furthermore, there is a corelation between the values of width W and thickness d and if at least one of width W and thickness d has an inappropriate value the current value corresponding to the lasing threshold value would not be reduced.

Herein, width W of the ridge-geometric stripe refers to a maximal width of the stripe as seen from a resonator's end surface of the semiconductor laser, as shown in FIG. 4. As such, if a ridge-geometric stripe 130 as seen in cross section is a trapezoid, as shown in FIG. 1, width W of the ridge-geometric stripe corresponds to the width of the bottom side of the trapezoid (see FIG. 1). Furthermore, thickness d of the residual film of the ridge-geometric stripe will refer to the thickness as measured from an interface of a light emitting layer 46 and a p-type layer 45 to the bottom of the ridge-geometric stripe, as shown in FIG. 4. In FIG. 4, light emitting layer 46 underlies p-type layer 45 and overlies an n-type layer 47.

Furthermore in the present specification a light emitting layer generally refers to a layer formed of a plurality of well layers and a plurality of barrier layers. It should not noted, however, that if a single-quantum well structure is applied a light emitting layer is formed of a single well layer.

The present invention contemplates a nitride semiconductor laser device grown on a nitride semiconductor substrate, wherein the aforementioned width W of the ridge-geometric stripe and thickness of the residual film of the ridge-geometric stripe have their respective, appropriate values to allow a lasing threshold value corresponding to a current value reduced to provide laser operation over a long period of time.

SUMMARY OF THE INVENTION

To achieve the above objects, the present invention provides a nitride semiconductor laser device including: a nitride semiconductor substrate; and a layered portion corresponding to a nitride semiconductor film grown on the nitride semiconductor substrate, the layered portion including an n-type layer and a p-type layer and a light emitting layer posed between the n- and p-type layers, of the n- and p-type layers a layer opposite to the nitride semiconductor substrate with the light emitting layer posed therebetween serving as an upper layer having a stripe of 1.9 $\mu$m to 3.0 $\mu$m in width, the light emitting layer and the upper layer having an interface distant from a bottom of the stripe by 0 $\mu$m to 0.2 $\mu$m. Thus the width of the stripe and the thickness of the residual film of the stripe can each have an appropriate value to provide a threshold value corresponding to a reduced current value.

In the present invention preferably the layered portion and the nitride semiconductor substrate sandwich a low-temperature buffer layer grown at a low temperature and thus formed. Thus if the nitride semiconductor substrate does not have a satisfactory crystallinity or a satisfactory surface morphology the layered portion can be provided satisfactorily.

In the present invention preferably the light emitting layer has P or As added thereto. Thus, electron and hole mobility can be improved to provide rapid modulation. Consequently the nitride semiconductor laser device can have an improved self-pulsation characteristic.

In the present invention, preferably, of the n- and p-type layers a layer closer to the nitride semiconductor substrate serves as a lower layer including a crack prevention layer containing In. Thus a crack can be prevented.

In the present invention preferably the light emitting layer starts with one of well and barrier layers, followed by the well and barrier layers alternately stacked thereon, and ends with the one of the well and barrier layers to have a multi-layered structure and the light emitting layer is formed of a total of two to six layers. This can provide a threshold value corresponding to a reduced current value.

In the present invention preferably the light emitting layer contains an impurity selected from the group consisting of Si, O, C, Ge, Zn and Mg. Thus, light emission can be intensified.

In the present invention preferably the upper layer includes a carrier block layer containing Al. Thus, carriers can be firmly confined to provide a threshold value corresponding to a low current value.

To achieve the above object, the present invention provides an optical pickup apparatus including the nitride semiconductor laser device as described above. Thus the optical pickup apparatus can provide laser operation having a threshold value corresponding to a low current value and thus have an extended longevity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Initially the present invention will be described and thereafter an embodiment of the present invention will be described.

The Present Invention

The present invention relates to allowing a nitride semiconductor laser device grown on a nitride semiconductor substrate to have width W of a ridge-geometric stripe and thickness d of a residual film of the ridge-geometric stripe that have their respective, appropriate values. In the present invention, width W and thickness d can have appropriate values, respectively, only for a nitride semiconductor laser fabricated on a nitride semiconductor substrate for the following reasons:

Firstly, a nitride semiconductor film grown on a nitride semiconductor substrate (a GaN substrate for example) has a greater carrier mobility than that grown on a conventional substrate (a substrate other than the nitride semiconductor substrate, such as a sapphire substrate, a SiC substrate and the like), since the use of the nitride semiconductor substrate results in a significant reduction of the density of a dislocation introduced penetrating the nitride semiconductor film.

Secondly, the use of the nitride semiconductor substrate uniformly reduces a distortion caused in the substrate and the nitride semiconductor film grown on the substrate that is attributed to the difference between the coefficient of thermal expansion of the substrate and that of thermal expansion of the film.

First Reason

Figure 5:
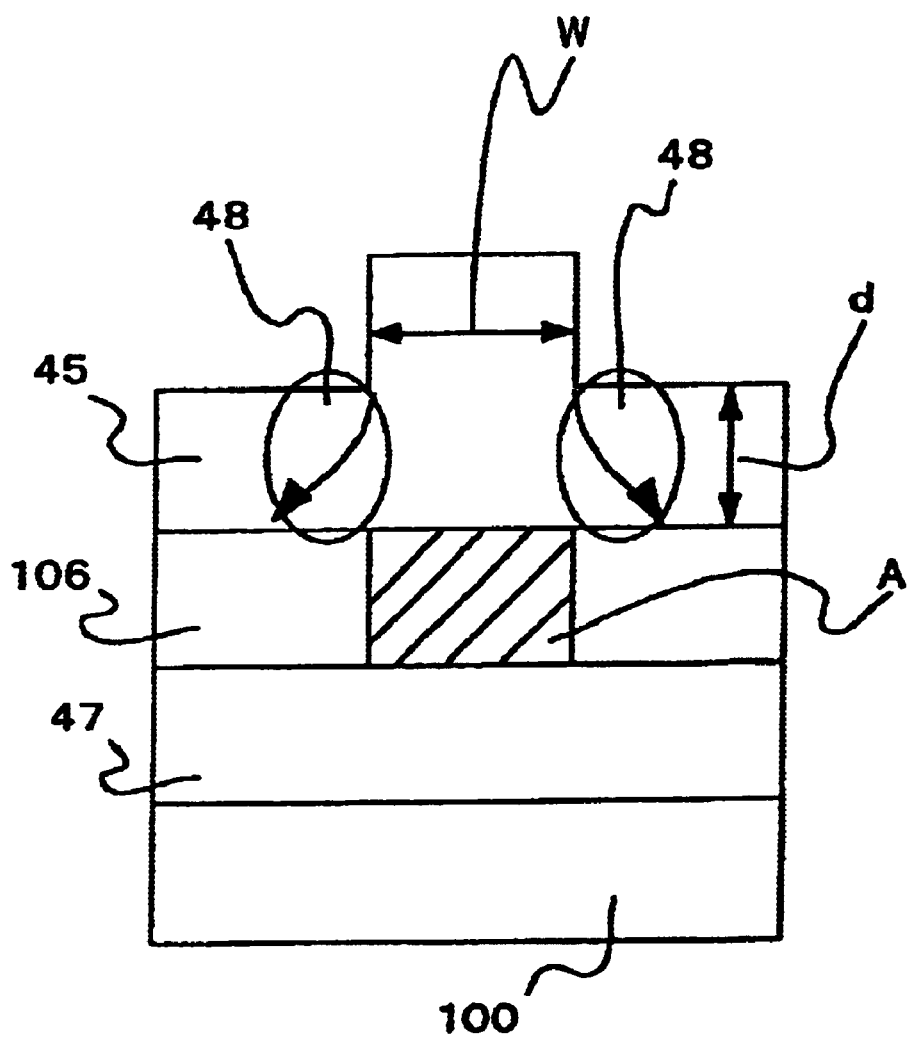
FIG. 5 illustrates how an introduced current spreads, as described in one embodiment of the present invention.

The first reason significantly affects the provision of width W of a ridge-geometric stripe and thickness d of a residual film of the ridge-geometric stripe of the present invention having appropriate values, respectively. More specifically, it is preferable that p-type layer 45 of nitride semiconductor is increased in carrier mobility as the laser device can operate on a reduced voltage and have a threshold value corresponding to a reduced current value, although consideration must be given to the following: since p-type layer 45 is enhanced in carrier mobility than for substrates other than that of nitride semiconductor, thickness d of the residual film of the ridge-geometric stripe having too large a value would result in an introduced current spreading wider than width W of the ridge-geometric stripe, as shown in FIG. 5 by an arrow 48. This means that the current cannot be introduced efficiently into the FIG. 5 light emitting layer at a region A, and as a result the current value corresponding to the threshold value will be increased. As such, thickness d is required to have an appropriate value. Furthermore, width W of the ridge-geometric stripe having too small a value, with p-type layer 45 enhanced in carrier mobility than for substrates other than that formed of nitride semiconductor, would result in a current injection region (corresponding to width W) receiving an amount of current smaller than that of current leaking outside width W (FIG. 5). As such, width W is required to have an appropriate value. Thickness d and width W as described above have their respective appropriate values, as will now be described in detail with reference to FIGS. 6 and 7.

Thickness d of Residual Film of Ridge-Geometric Stripe

Figure 4:
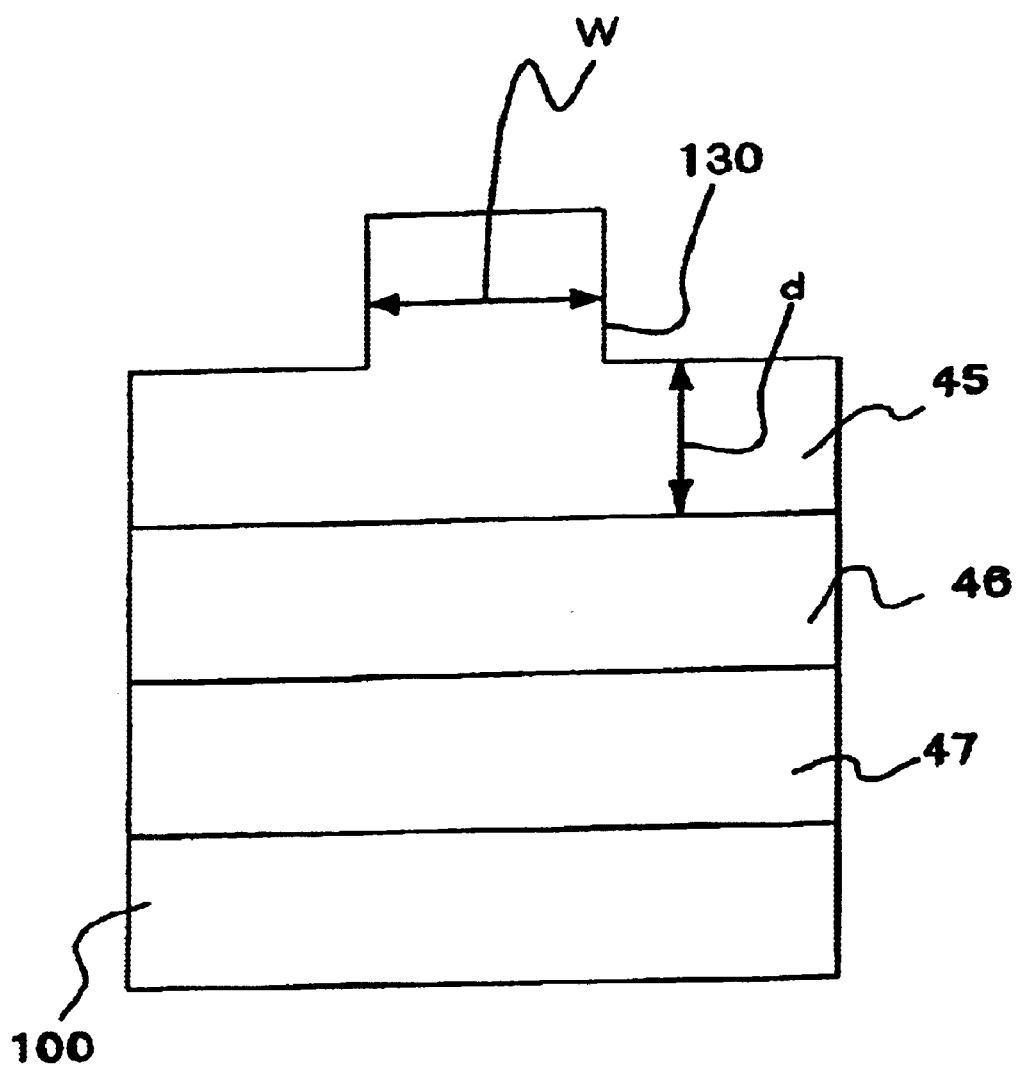
FIG. 4 is a schematic diagram for illustrating width W of a ridge-geometric stripe and thickness d of a residual film of the ridge-geometric stripe.
Figure 6:
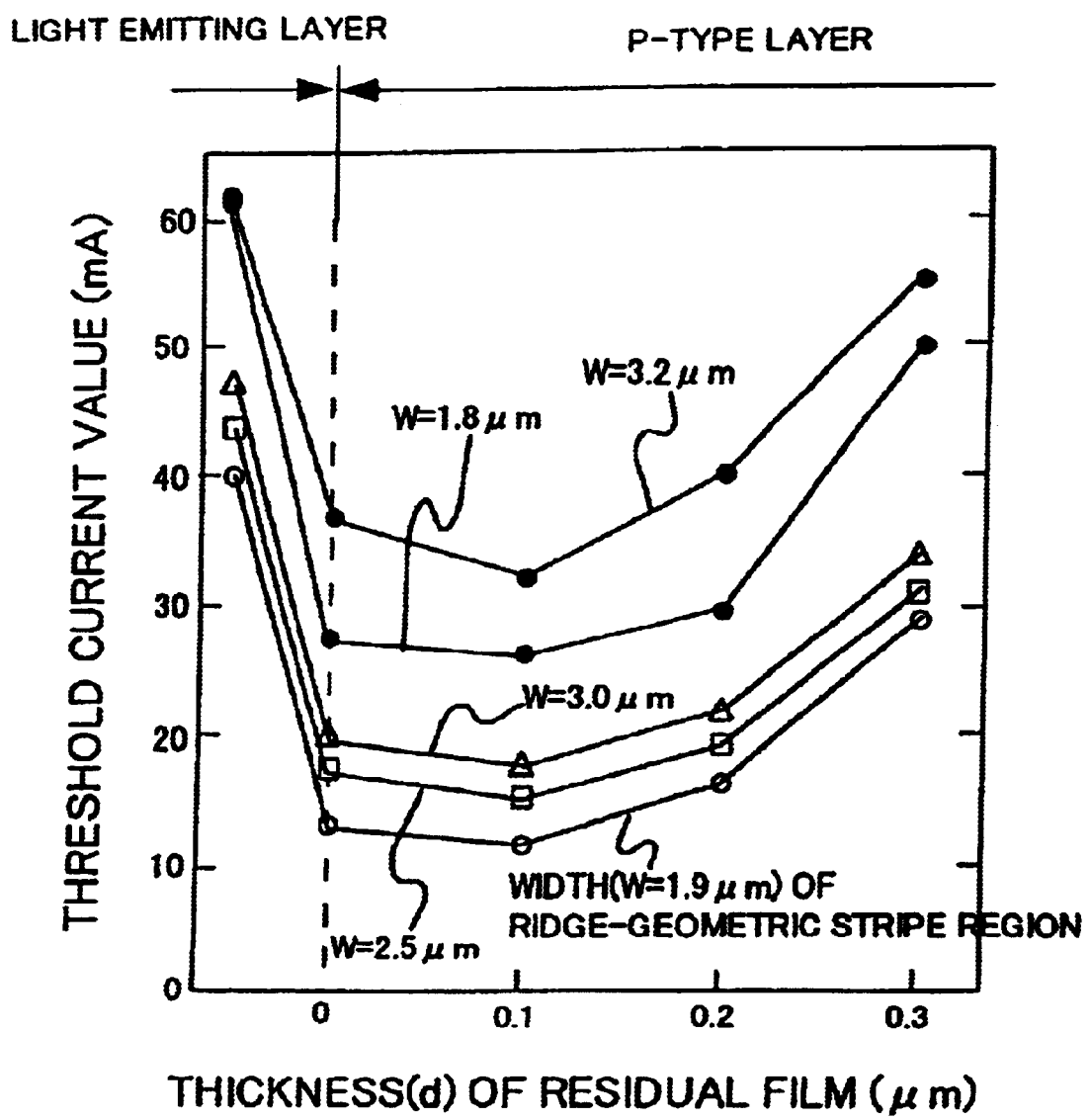
FIG. 6 is a graph of a current value corresponding to a threshold value versus thickness d of a residual film of a ridge-geometric stripe.

FIG. 6 represents a corelation between thickness d of a residual film of a ridge-geometric stripe of the FIG. 4 nitride semiconductor laser and a threshold current value for the laser. As can be seen from FIG. 6, for thickness d of 0 μm to 0.2 μm the threshold current value is low and for thickness d failing to fall within the aforementioned range the threshold value current increases. It can also be seen that even if thickness d falls within the above appropriate range in value (of 0 μm to 0.2 μm), a ridge-geometric stripe that has width W of an inappropriate value results in an increased threshold current value. As shown in FIG. 6, the residual film of the ridge-geometric stripe that has a thickness greater than 0.2 μm results in an increased threshold current value because a current introduced spreads, as has been described previously. The residual film of the ridge-geometric stripe that has thickness d less than 0 μm (corresponding in FIG. 6 to a thickness of the residual film having a negative value, which corresponds to the ridge-geometric stripe provided deeper to reach the light emitting layer) results in an increased threshold current value because the ridge-geometric stripe provided deeper to reach the light emitting layer significantly impairs the light emitting layer and thus significantly reduces the gain of the light emitting layer. It has been revealed from FIG. 6 that preferably the residual film of the ridge-geometric stripe has thickness d of 0 μm to 0.2 μm to reduce the laser's threshold current value.

Width W of Ridge-Geometric Stripe

Figure 7:
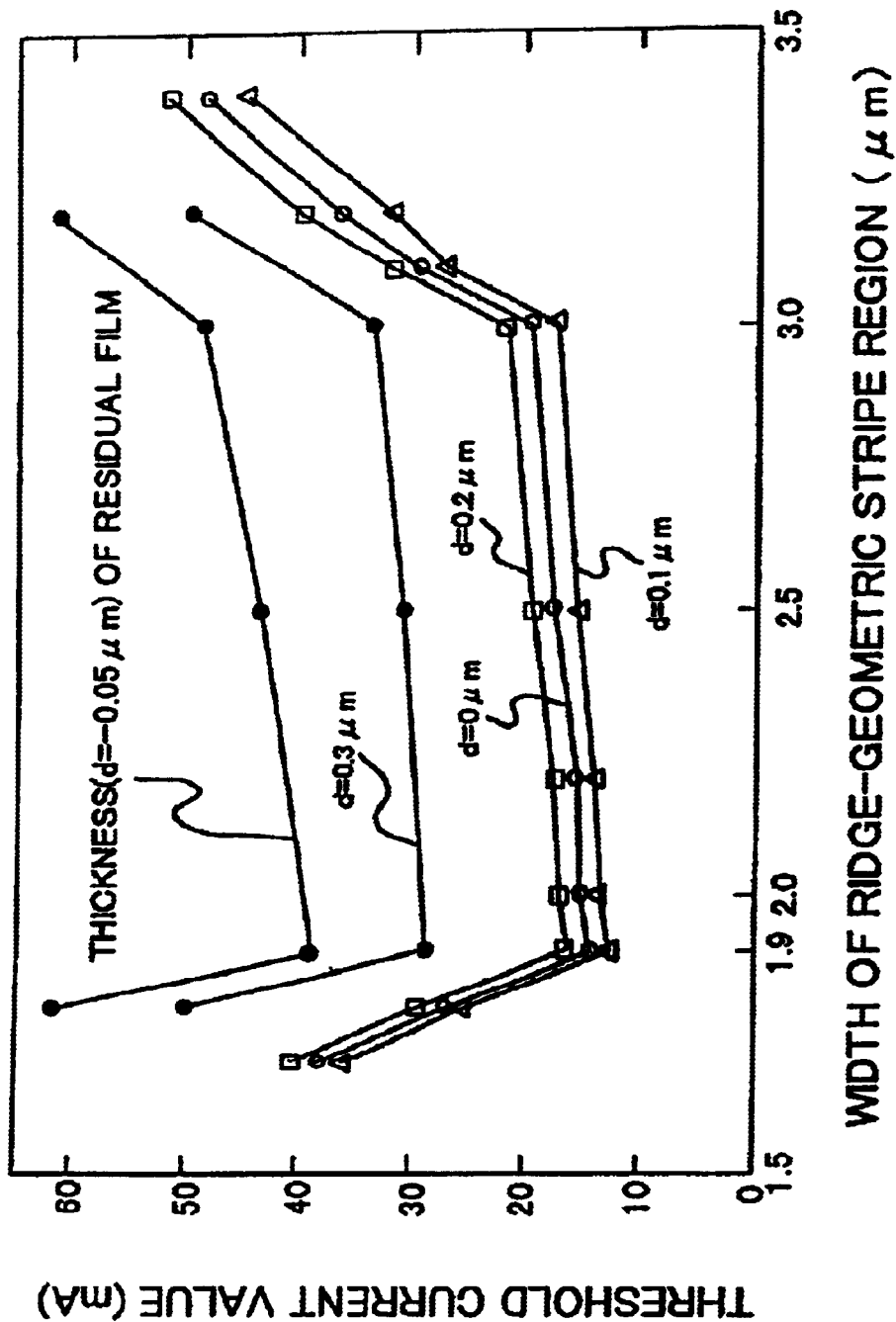
FIG. 7 is a graph of a current value corresponding to a threshold value versus width W of a ridge-geometric stripe.

FIG. 7 represents a corelation between width W of a ridge-geometric stripe of the FIG. 4 nitride semiconductor laser and a threshold current value for the laser. As can be seen from FIG. 7, for width W of 1.9 μm to 3.0 μm a small threshold current value is attained. It can also be seen that if width W falls within the aforementioned appropriate range (of 1.9 μm to 3.0 μm), the residual film of the ridge-geometric stripe that has thickness d failing to have an appropriate value (of 0 μm to 1.2 μm) results in an increased threshold current value. As shown in FIG. 7, the ridge-geometric stripe having a width smaller than 1.9 μm results in an increased threshold current value because current introduced spreads over an area wider than the aforementioned current injection region. When width W is further reduced, current density is increased and the light emitting layer is also heated rapidly. As such, carrier is excited to a higher energy level, resulting in an increased current value corresponding to a lasing threshold value that is required for population inversion (i.e., an increased number of carriers). In contrast, the ridge-geometric stripe having a width greater than 3.0 μm results in a decreasing threshold current density and hence an increasing threshold current density. It has been revealed from FIG. 7 that preferably the ridge-geometric stripe has width W of 1.9 μm to 3.0 μm to reduce the laser's threshold current value.

Second Reason

The second reason will now be described. It significantly affects the provision of width W of a ridge-geometric stripe and thickness d of a residual film of the ridge-geometric stripe in the present invention. More specifically, reference will now be made to FIG. 8 to describe a difference between a nitride semiconductor film grown on a pseudo GaN substrate 800 shown in FIG. 8 and that grown on a nitride semiconductor substrate.

Figure 8:
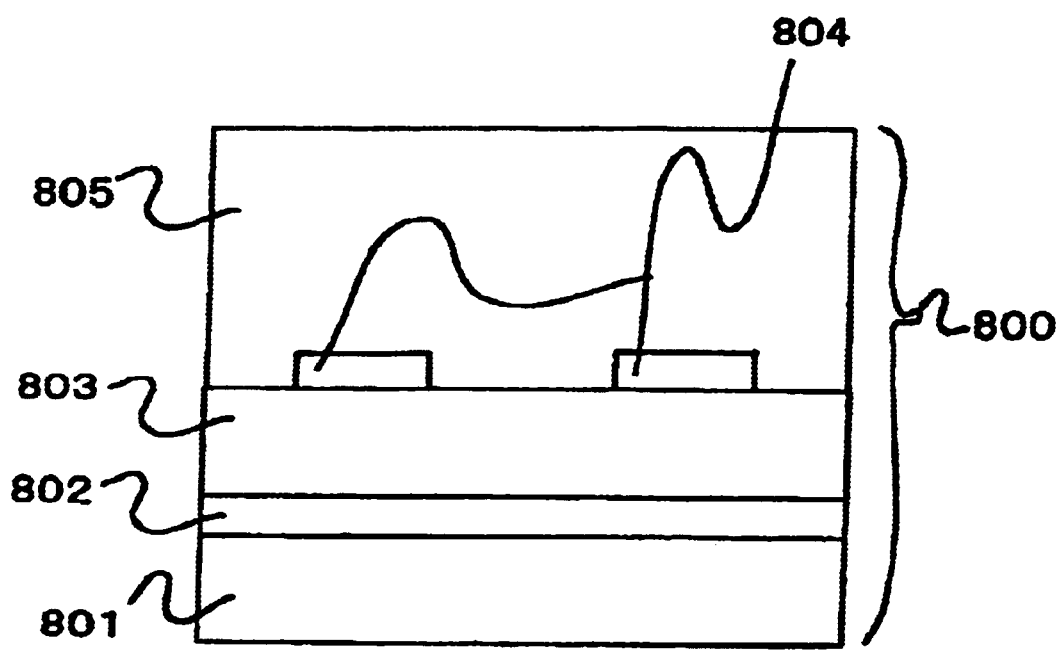
FIG. 8 schematically shows a pseudo GaN substrate.

The FIG. 8 pseudo GaN substrate 800 is formed of a seed substrate 801, a low-temperature buffer layer 802, an n-type GaN film 803, a growth prevention film 804 and a thick, n-type GaN film 805. In pseudo GaN substrate 800, seed substrate 801 is a substrate other than a substrate of nitride semiconductor and it is used as a base for growing thick, n-type GaN film 805. The pseudo GaN substrate referred to herein is not limited to the FIG. 8 structure and it may have any structure that at least has the aforementioned seed substrate and growth prevention film (which may be a cavity), although growth prevention film 804 may be a dielectric film, a metallic film or the like or it may be a cavity.

A nitride semiconductor film grown on the pseudo GaN substrate described above is known as being capable of attaining a smaller density of a dislocation penetrating therethrough than that grown on a sapphire substrate, an SiC substrate or the like. Thus the use of the pseudo GaN substrate can also satisfy the first reason described above.

However, the pseudo GaN substrate has a seed substrate, which introduces a stress attributed distortion into a nitride semiconductor film grown on the pseudo GaN substrate. This stress attributed distortion results in the nitride semiconductor substrate having a varying carrier mobility. Furthermore, with the pseudo GaN substrate including the growth prevention film to provide a reduced density of a dislocation for penetration, a nitride semiconductor film grown exactly on growth prevention film 804 is free from a significant, stress attributed distortion that comes from the seed substrate. As a result, the nitride semiconductor film grown on the pseudo GaN substrate has a portion with a stress attributed distortion and that free thereof. Furthermore, if growth prevention film 804 is formed in a stripe, as shown in FIG. 8, a monoaxial stress tends to be exerted in the growth plane and as an effective mass varies a carrier mobility also varies depending on the direction of the stress introduced. As such, if a nitride semiconductor laser device is fabricated on a pseudo GaN substrate, the laser device (a p-type layer) locally has portions having different carrier mobilities and if current is introduced via a ridge-geometric stripe it would not be introduced uniformly into the light emitting layer and the laser's threshold current value can thus hardly be controlled with width W of the ridge-geometric stripe and thickness d of a residual film of the ridge-geometric stripe, as has been described according to the first reason. In contrast, a nitride semiconductor film grown on a nitride semiconductor substrate does not have the seed substrate as described above and it can thus be free of local, different, stress attributed distortions to uniformly reduce a stress attributed distortion resulting from the difference between the coefficient of thermal expansion of the substrate and that of thermal expansion of the film.

Thus, if a nitride semiconductor laser device is fabricated on a nitride semiconductor substrate, the laser device (a p-type layer) can have a uniform carrier mobility thereacross, current can be introduced uniformly into the light emitting layer, and the laser's threshold current value can thus be reduced, satisfactorily controlled by width W of the ridge-geometric stripe and thickness d of the residual film of the ridge-geometric stripe, as described in the first reason.

It is understood from the above description that in the present semiconductor laser device with crystal growth on a nitride semiconductor substrate (e.g., a GaN substrate), a low threshold current value can be attained by a ridge-geometric stripe having width W having an appropriate value of 1.9 $\mu$m to 3.0 $\mu$m, and the stripe's residual film having thickness d having an appropriate value of 0 $\mu$m to 0.2 $\mu$m.

Then with width W and thickness d both in their respective appropriate ranges a nitride semiconductor laser device was fabricated and tested for longevity. It had a longevity of no less than 1000 hours at an ambient temperature of 50° C. and for an output of 40 mW. Thus the fabrication of the present nitride semiconductor laser allows a high-output nitride semiconductor laser and it can be applied to an optical pickup apparatus for recording and reproduction.

Example of a Nitride Semiconductor Laser Diode Employing the Present Invention

The present invention provides a nitride semiconductor laser diode device fabricated as will now be described hereinafter.

Crystal Growth

Figure 1:
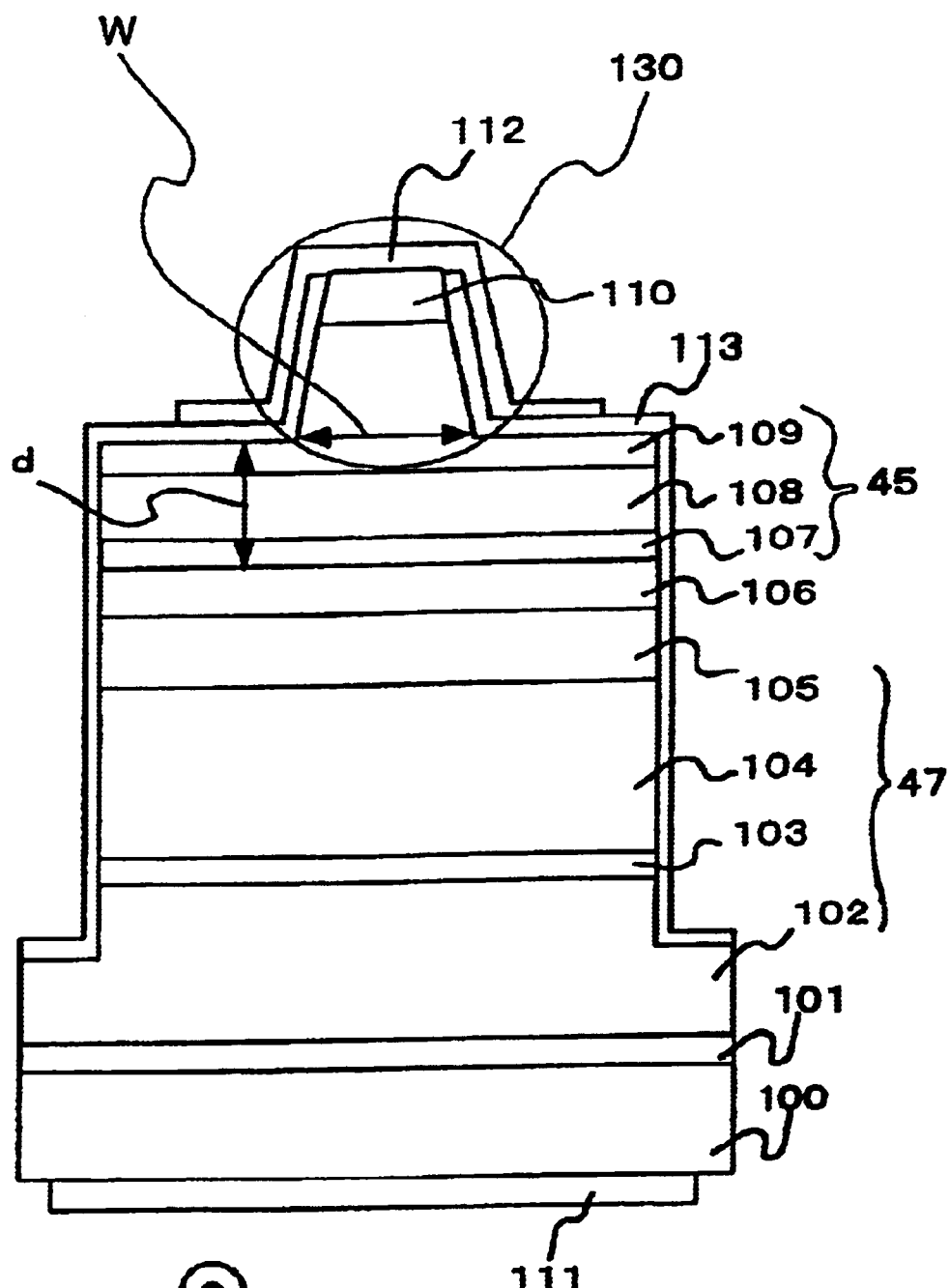
FIG. 1 shows one example of a structure of a laser employing a nitride semiconductor substrate as described in one embodiment of the present invention.

FIG. 1 shows a laser device formed of a C plane (0001) n-type GaN substrate 100, a low-temperature GaN buffer layer 101, an n-type GaN layer 102, an n-type $In_{0.07}Ga_{0.93}N$ crack prevention layer 103, an n-type $Al_{0.1}Ga_{0.9}N$ clad layer 104, an n-type GaN optical guide layer 105, a light emission layer 106, p-type $Al_{0.2}Ga_{0.8}N$ carrier block layer 107, p-type GaN optical guide layer 108, a p-type $Al_{0.1}Ga_{0.9}N$ clad layer 109, a p-type GaN contact layer 110, an n electrode 111, a p electrode 112, and a $SiO_2$ dielectric film 113.

Initially, n-type GaN substrate 100 is set in an MOCVD apparatus (in an organometallic, vapor-phase growth process) and $NH_3$ (ammonium) corresponding to a group V source material and TMGa (trimethyl gallium) corresponding to a Group III source material are used to grow low-temperature GaN buffer layer 101 of 100 nm at a growth temperature of 550° C. Then at a growth temperature of 1050° C. $SiH_4$ (silane) is added to the aforementioned source materials to form n-type GaN layer 102 (having a Si dopant concentration of $1\times10^{18}/cm^3$) of 3 $\mu$m. Then a growth temperature of 700° C. is increased to that of approximately 800° C. and TMIn (trimethyl indium) corresponding to a Group III source material is supplied to grow n-type $In_{0.07}Ga_{0.93}N$ crack prevention layer 103 of 40 nm. Then again the substrate temperature is increased to 1050° C. and TMAl (trimethyl aluminum) corresponding to a Group III source material is employed to grow n-type $Al_{0.1}Ga_{0.9}N$ clad layer 104 of 0.8 $\mu$m in thickness (with a Si dopant concentration of $1\times10^{18}/cm^3$) and then grow n-type GaN optical guide layer 105 (having a Si dopant concentration of $1\times10^{18}/cm^3$) of 0.1 $\mu$m. Then the substrate temperature is reduced to 800° C. to grow three periods of light emitting layer 106 (a multi-quantum well structure) configured of an $In_{0.18}Ga_{0.82}N$ well layer of 4 nm in thickness and an $In_{0.05}Ga_{0.95}N$ barrier layer of 8 nm in thickness, in the order of a barrier layer/a well layer/a barrier layer/a well layer/a barrier layer/a well layer/a barrier layer. In growing light emitting layer 106, $SiH_4$ (with a Si dopant concentration of $1\times10^{18}/cm^3$) is added to both of the barrier and well layers. Between a barrier layer and a well layer or between a well layer and a barrier layer there may be introduced in the growth an interruption in a range of one second to 180 seconds. This is preferable as each layer can be enhanced in planarity and a reduced emission half-width can be achieved.

Then the substrate temperature is again increased to 1050° C. to grow p-type $Al_{0.2}Ga_{0.8}N$ carrier block layer 107 of 20 nm thick, p-type GaN optical guide layer 108 of 0.1 μm, p-type $Al_{0.1}Ga_{0.9}N$ clad layer 109 of 0.5 μm and p-type GaN contact layer 110 of 0.1 μm. As the aforementioned p-type dopant is added Mg ($EtCP_2Mg$: bisethylcyclopentadienylmagnesium) of $5×10^{19}$ to $2×10^{20}/cm^3$).

Preferably, p-type GaN contact layer 110 has a p-type dopant concentration increasing as it gets closer to the location at which p-type electrode 112 is formed. This can reduce a contact resistance attributed to the formation of the p electrode. Furthermore, when a p-type layer is being grown a small amount of oxygen may be mixed to remove hydrogen residing in the p-type layer that prevents activation of Mg corresponding to the p-type dopant.

After p-type GaN contact layer 110 is thus grown, the MOCVD apparatus's reactor has its internal atmosphere replaced by nitrogen carrier gas and $NH_3$ and thus reduced in temperature at a rate of 60° C. per minute. When the substrate temperature has reached 800° C., the supply of $NH_3$ is stopped and the substrate is allowed to have the aforementioned temperature for five minutes and then cooled to a room temperature. Preferably, the substrate is held at 650° C. to 900° C. and allowed to have such temperature for three to ten minutes. Furthermore the substrate temperature preferably drops at a rate of at least 30° C. per minute. A growth film thus prepared is estimated in a Raman measurement and it has been found that the technique described above can eliminate the necessity of providing p-type annealing employed for conventional nitride semiconductor as the grown film has already exhibited p-type characteristic (i.e., Mg has already been activated). It has also been found that the contact resistance attributed to the formation of the p electrode has also been reduced. It has also been found preferable that conventional p-type annealing be also combined as it can enhance the Mg activation rate.

In the present embodiment, low-temperature GaN buffer layer 101 may be a low-temperature AlN buffer layer or the low-temperature buffer layer itself may be dispensed with, although preferably low-temperature GaN buffer layer 101 or a low-temperature AlN buffer layer is inserted as the GaN substrate currently used does not have a preferable crystallinity or a preferable surface morphology.

In the present embodiment $In_{0.07}Ga_{0.93}N$ crack prevention layer 103 may include In having a constituent ratio other than 0.07 or the InGaN crack prevention layer itself may be dispensed with, although preferably the InGaN crack prevention layer is inserted if the clad layer and the GaN substrate have a significant lattice mismatch therebetween.

While in the present embodiment the light emitting layer is structured to start with a barrier layer and end with a barrier layer, it may be structured to start with a well layer and end with a well layer. Furthermore, the number of layers forming the light emitting layer (i.e., the number of well layers) is not limited to three layers, as described above, and the light emitting layer having no more than ten layers allowed a low threshold current value and continuous laser operation at room temperature. In particular, the light emitting layer having two to six layers was preferable, attaining a low threshold current value.

While in the present embodiment the light emitting layer has a well layer and a barrier layer both having added thereto $Si(SiH_4)$ of $1×10^{18}/cm^3$, the light emitting layer may dispense with a dopant, although adding a dopant to the light emitting layer provides intense light emission. The light emitting layer may have added thereto a dopant O, C, Ge, Zn or Mg, rather than Si. Preferably the dopant is added in an amount of $1×10^{17}$ to $1×10^{19}/cm^3$. Furthermore the dopant may be added to only one of the well and barrier layers rather than both of the layers.

In the present embodiment p-type $Al_{0.2}Ga_{0.8}N$ carrier block layer 107 may have an Al constituent ratio other than 0.2 or the carrier block layer itself may be dispensed with, although the provision of the carrier block layer resulted in a low threshold current value, since the carrier block layer acts to confine carriers in the light emitting layer of the present invention. Increasing the Al constituent ratio of the carrier block layer is preferable as it can enhance the aforementioned carrier confinement. It is also preferable to minimize the Al constituent ratio while maintaining carrier confinement, since the carrier block layer can be enhanced in carrier mobility and a reduced device resistance can be achieved.

While in the present embodiment the p and n clad layers are formed of $Al_{0.1}Ga_{0.9}N$, it may be formed of a ternary-system crystal of AlGaN having an Al constituent ratio other than 0.1. Increasing the Al mix crystal ratio can increase the energy gap difference and refraction index difference between the clad layers and the light emitting layer to efficiently confine carriers and light in the light emitting layer reduce the current value corresponding to the threshold for laser operation. Furthermore, if the Al constituent ratio is reduced with carrier and light confinement maintained, the clad layer's carrier mobility can be enhanced and the laser device's resistance can be reduced. Thus the laser device's operating voltage can be reduced.

Preferably, the AlGaN clad layer has a thickness of 0.8 μm to 1.0 μm. This allows a vertical lateral mode to be more unimodal and can confine light more efficiently to allow the laser to have an enhanced optical characteristic and a lasing threshold value corresponding to a reduced current value.

The clad layer is not limited to a ternary-system mix crystal of AlGaN and it may be a quaternary mix crystal of AlInGaN, AlGaNP or AlGaNAs. Furthermore, the p-type clad layer may have a superlattice structure formed of a p-type AlGaN layer and a p-type GaN layer to reduce the device resistance.

While the present embodiment has been described with a GaN substrate having a main surface corresponding to a C plane {0001}, the substrate's main surface may have a different plane orientation corresponding to an A plane {11-20}, an R plane {1-102} or an M plane {1-100}. Furthermore, if the substrate has an angle offset from the above plane orientations by no more than two degrees, it can have a satisfactory surface morphology. The GaN substrate may be any substrate formed of nitride semiconductor and it may be any substrate formed of $Al_xGa_yIn_zN$, wherein $0≤x≤1$, $0≤y≤1$, $0≤z≤1$, and $x+y+z=1$. For nitride substrate laser, to allow a vertical lateral mode to be unimodal a layer having a lower index of refraction than a clad layer is required in contact with an outer side of the clad layer and an AlGaN substrate is the best choice. Furthermore, in the $Al_xGa_yIn_zN$ substrate, wherein $0≤x≤1$, $0≤y≤1$, $0≤z≤1$, and $x+y+z=1$, approximately no more than 10% of nitride may be substituted with any of As, P and Sb, although the nitride is required to be hexagonal. Furthermore, Si, O, Cl, S, C, Ge, Zn, Cd, Mg, Be may be used as a dopant. For an n-type nitride semiconductor substrate, of the aforementioned dopants Si, O, Cl are particularly preferable.

While in the present embodiment, on a substrate n-type layer 47, light emitting layer 106 and p-type layer 45 are successively grown, the order of the layers may be inverted and on the substrate a p-type layer, a light emitting layer and an n-type layer may be grown successively.

While in the present embodiment a crystal growth method using an MOCVD apparatus is employed, molecular beam epitaxy (MBE) or hydride vapor phase epitaxy (HVPE) may alternatively be employed.

Process

Hereinafter, a description will be made of a process for manufacturing a laser diode device from an epitaxial wafer output from an MOCVD apparatus.

Since the present embodiment employs n-type GaN substrate 100, on that side of substrate 100 opposite to that provided with the laser device Hf and then Al are successively applied to form n electrode 111. The n electrode may alternatively be formed for example of Ti/Al, Ti/Mo, Hf/Au or the like. Using Hf for the n electrode is effective as this can reduce the contact resistance of the n electrode.

The p electrode is provided as follows: an etching step is employed to form a stripe along a <1-100> orientation of the GaN substrate to form a ridge-geometric stripe 130 (FIG. 1) having width W of 2.0 μm with a residual film thereof having thickness d of 0.15 μm. Then a $SiO_2$ dielectric film 113 is deposited, p-type GaN contact layer 110 is exposed, and Pd, Mo and Au are successively deposited to form a p electrode 112. The p electrode may alternatively be formed of Pd/Pt/Au, Pd/Au or Ni/Au.

Figure 2:
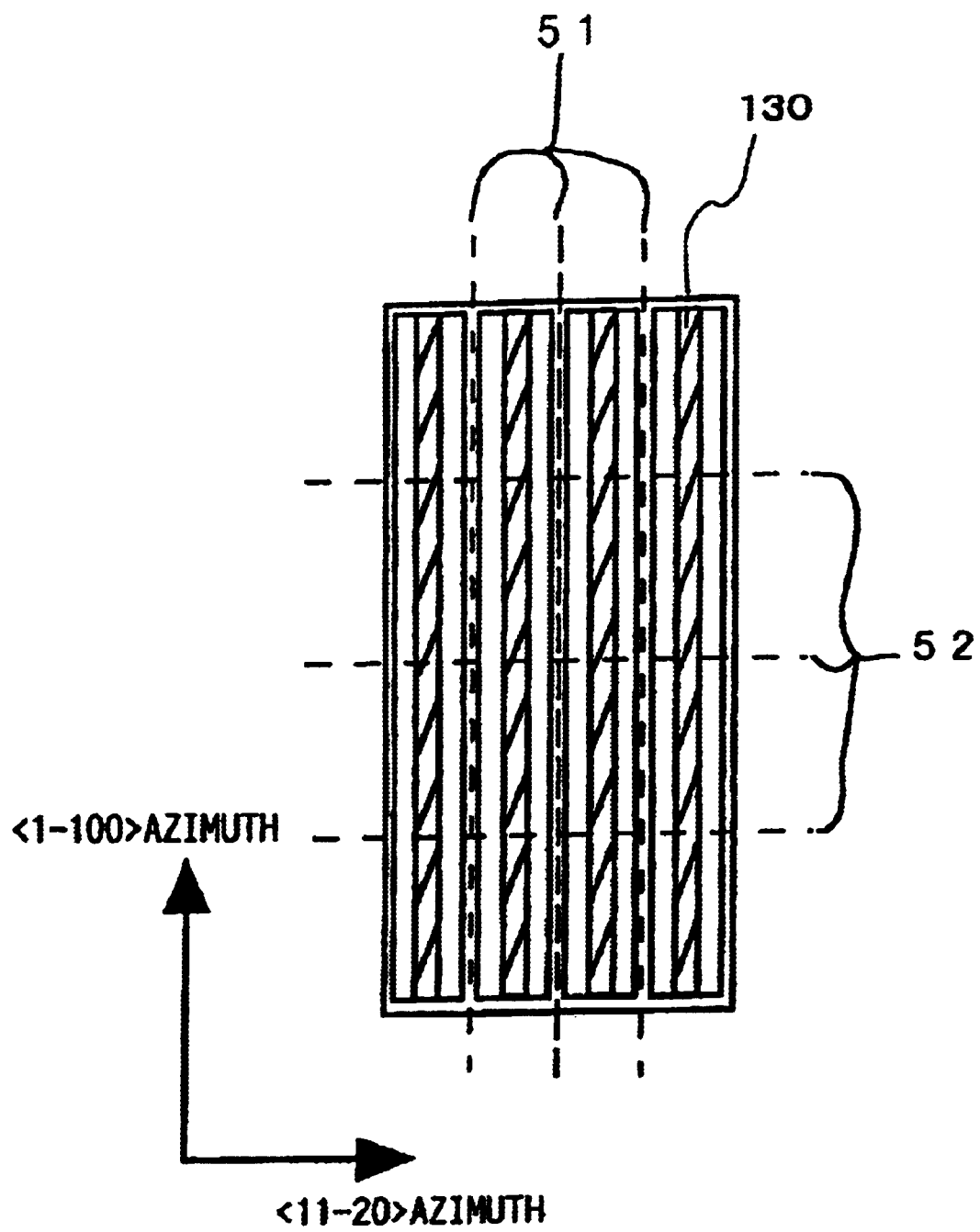
FIG. 2 is a top view of a structure of a laser as described in one embodiment of the present invention.

Finally, a cleavage of the GaN substrate is utilized to fabricate a Fabry-Perot resonator having a resonator length of 500 μm. Typically, a resonator length of 300 μm to 1000 μm is preferable. The resonator is with the GaN substrate's M plane ({1–100} plane) corresponding to the mirror end surface (FIG. 2). The substrate is cleaved and the laser device is divided into chips by scribing the substrate along broken lines 51 and 52 shown in FIG. 2. This can provide high yield since scribing debris for example attributed to the steepness of the end surface or resulting from the scribing operation can be prevented from adhering to an epitaxial surface. Other than the above laser resonator feedback technique, distributed feedback (DFB) and distributed Bragg reflector (DBR), generally known techniques, may also be employed. After the laser device has been divided along broken line 52 and the Fabry-Perot resonator's mirror end surface has thus been formed, a dielectric film of $SiO_2$ and that of $TiO_2$ having a reflectance of 70% are alternately deposited on the mirror end surface to provide multilayered dielectric reflection film. The aforementioned dielectric materials may be replaced by $SiO_2/Al_2O_3$ to provide the multilayered dielectric reflection film.

N electrode 111 is formed on that side of n-type GaN substrate 111 opposite to that provided with the laser device. Alternatively, dry etching may be employed to expose n-type GaN layer 102 in a front side of an epitaxial wafer to form an n electrode.

Packaging

The above laser diode chip is packaged in a manner as described below: if it is used as a bluish violet (of 410 nm in wavelength), high output (of 40 mW) laser suitable for a high-density recording optical disk, its heat sink effect must be considered. For example, preferably a soldering material of In is employed in a junction-up system to connect the chip to the body of a package. Alternatively, it may be attached to the body of a package or a heat sink via a submount of Si, AlN, diamond, Mo, CuW, BN, rather than attached directly thereto.

Thus the present nitride semiconductor laser diode can be fabricated.

FIRST EXAMPLE

The present example is identical to the embodiment except that the ridge-geometric stripe has width W of 3.0 μm and the residual film of the ridge-geometric stripe has thickness d of 0.2 μm. The nitride semiconductor laser device of the present example also has characteristics as described in the embodiment (FIGS. 6 and 7).

SECOND EXAMPLE

The present example is identical to the embodiment except that the ridge-geometric stripe has width W of 2.5 μm and the residual film of the ridge-geometric stripe has thickness d of 0.05 μm. The nitride semiconductor laser device of the present example also has characteristics as described in the embodiment (FIGS. 6 and 7).

THIRD EXAMPLE

The present example is identical to the embodiment except that the ridge-geometric stripe has width W of 1.9 μm and the residual film of the ridge-geometric stripe has thickness d of 0.1 μm. The nitride semiconductor laser device of the present example also has characteristics as described in the embodiment (FIGS. 6 and 7).

FOURTH EXAMPLE

The present example is identical to the embodiment except that the ridge-geometric stripe has width W of 2.2 μm and the residual film of the ridge-geometric stripe has thickness d of 0 μm. The nitride semiconductor laser device of the present example also has characteristics as described in the embodiment (FIGS. 6 and 7).

FIFTH EXAMPLE

The present example is identical to the embodiment except that the light emitting layer has P or As added thereto. Adding P or As to the light emitting layer allows the light emitting layer's electrons and holes to be reduced in effective mass. Thus the present nitride semiconductor laser device had a lasing threshold corresponding to a current value smaller by approximately 5 mA than a conventional nitride semiconductor laser device free of P or As. Adding P or As can also enhance electron and hole mobility. As such, if in the present nitride semiconductor laser diode at the light emitting layer an electron and a hole disappear due to reactive recombination a new electron and hole is injected through diffusion more rapidly than in a nitride semiconductor laser diode having a light emitting layer free of P or As. The rapid electron and hole modulation allows the nitride semiconductor laser diode to have a significantly improved self-pulsation characteristic. The present example provided a characteristic related to width W of a ridge-geometric stripe and thickness d of a residual film of the ridge-geometric stripe that is identical to that provided in the embodiment (FIGS. 6 and 7).

SIXTH EXAMPLE

In the present example the nitride semiconductor laser of the present invention is applied to a semiconductor light emission apparatus. For example, as compared with a conventional nitride semiconductor laser, the present nitride semiconductor laser of bluish violet color (with a lasing wavelength of 400 to 410 nm) can provide a laser semiconductor apparatus which has a lasing threshold corresponding to a low current value and an extended longevity. Furthermore it can provide stable operation for a high output (of 40 mW) in a high-temperature ambient and it is thus a laser suitable for an optical disk for high-density recording and reading.

Figure 3:
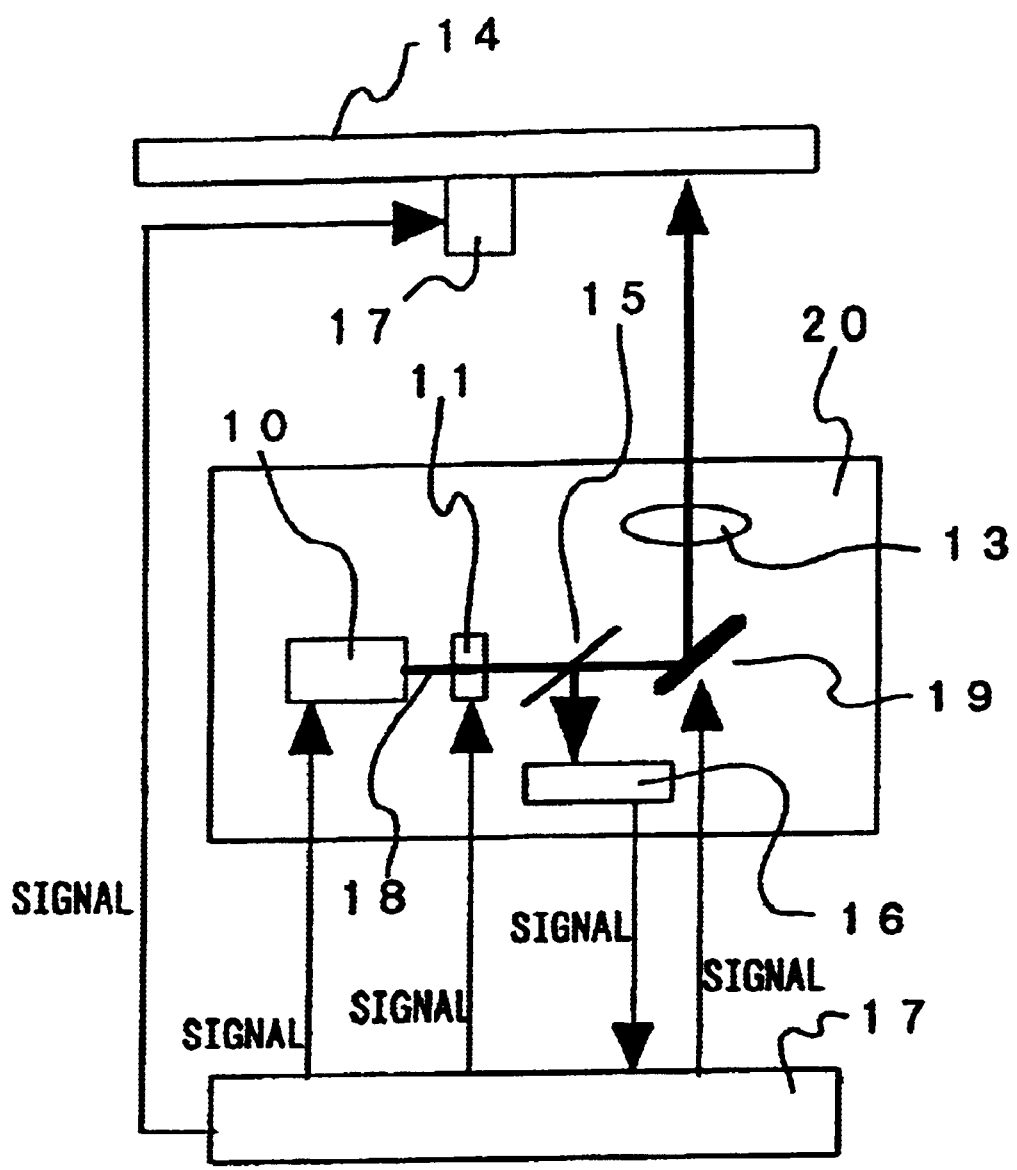
FIG. 3 schematically shows an optical disk apparatus as one example of an information recording apparatus.

FIG. 3 schematically shows an optical disk apparatus as one example of an information recording apparatus employing an optical pickup apparatus 20 of the present invention. A nitride semiconductor laser device 10 outputs a laser beam 18 which is in turn modulated by an optical modulator 11 to reflect input formation, has its direction changed by a controlled mirror 19, passes through a lens 13 and is then recorded on an optical disk 14. In reading information, a laser beam optically changed by a pit arrangement provided on optical disk 14 is transmitted through a splitter 15 and detected by a photodetector 16 to be a reproduced signal. The series of operations is controlled by a control circuit 17. A motor 19, rotating optical disk 14, is also controlled by control circuit 17. Typically, a laser output of 40 mW is provided to record information and a laser output of approximately 5 mW is provided to read information.

It should be noted that laser beam 18 may not be modulated by optical modulator 11. For example, laser 10 may be driven with power which is modulated to reflect input information to modulate laser beam 18. Alternatively, laser beam 18 may remain free of modulation while in a vicinity of optical disk 14 a magnetic field may be modulated to write information on a recording side of optical disk 14.

The present optical pickup apparatus is also effective when it is applied to laser printers, DVD apparatus, projectors using a laser diode of three basic colors (blue, green, red) of light that employs the light emitting layer of the present invention, and the like.

The present invention provides a nitride semiconductor laser device and semiconductor light emission apparatus thereof which has a lasing threshold corresponding to a smaller current value and hence a longer longevity than conventional nitride semiconductor laser.

In the specification, the p-type layer and the n-type layer are referred to according to traditional practice to indicate a semiconductor supplying the light emitting layer with holes or that supplying the light emitting layer with electrons when the device operates, and they are not defined to have their respective regions all in effect exhibiting a property of a p-type semiconductor and that of an n-type semiconductor, respectively. For example specifically in an embodiment the optical guide layer, the carrier block layer and the like may be of i-type.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor laser device, comprising:
   a nitride semiconductor substrate; and
   a layered portion corresponding to a nitride semiconductor film grown on said nitride semiconductor substrate, said layered portion including an n-type layer and a p-type layer and a light emitting layer posed between said n- and p-type layers, of said n- and p-type layers a layer opposite to said nitride semiconductor substrate with said light emitting layer posed therebetween serving as an upper layer having a stripe of 1.9 μm to 2.5 μm in width, said light emitting layer and said upper layer having an interface distant from a bottom of said stripe by 0 μm to 0.2 μm,
   wherein said light emitting layer starts with one of well and barrier layers, followed by said well and barrier layers alternately stacked thereon, and ends with said one of said well and barrier layers to have a multi-layered structure and emitting layer has three wall layers.

2. The nitride semiconductor laser device of claim 1, wherein said layered portion and said nitride semiconductor substrate sandwich a low-temperature buffer layer grown at a low temperature and thus formed.

3. The nitride semiconductor laser device of claim 1, wherein said light emitting layer has one of P and As added thereto.

4. The nitride semiconductor laser device of claim 1, wherein of said n- and p-type layers a layer closer to said nitride semiconductor substrate serves as a lower layer including a crack prevention layer containing In.

5. The nitride semiconductor laser device of claim 1, wherein said light emitting layer contains an impurity selected from the group consisting of Si, O, C, Ge, Zn and Mg.

6. The nitride semiconductor laser device of claim 2, wherein said light emitting layer contains an impurity selected from the group consisting of Si, O, C, Ge, Zn and Mg.

7. The nitride semiconductor laser device of claim 3, wherein said light emitting layer contains an impurity selected from the group consisting of Si, O, C, Ge, Zn and Mg.

8. The nitride semiconductor laser device of claim 4, wherein said light emitting layer contains an impurity selected from the group consisting of Si, O, C, Ge, Zn and Mg.

9. The nitride semiconductor laser device of claim 1, wherein said upper layer includes a carrier block layer containing Al.

10. The nitride semiconductor laser device of claim 3, wherein said upper layer includes a carrier block layer containing Al.

11. An optical pickup apparatus comprising the nitride semiconductor laser device as recited in claim 1.

12. A nitride semiconductor laser device, comprising:
    a nitride semiconductor substrate; and
    a layered portion corresponding to a nitride semiconductor film grown on said nitride semiconductor substrate, said layered portion including a lower layer and an upper layer and a light emitting layer posed between said lower and upper layers, said upper layer that is farther from said nitride semiconductor substrate with said light emitting layer having a ridge-geometric stripe of 1.9 μm to 2.5 μm in width, said light emitting layer and said upper layer having an interface distant from a bottom of said ridge geometric stripe by 0 μm to 0.2 μm,
    wherein said light emitting layer starts with one of well and barrier layers, followed by said well and barrier layers alternately stacked thereon, and ends with said one of said well and barrier layers to have a multi-layered structure and said light emitting layer has three well layers.

13. The nitride semiconductor laser device of claim 12, wherein said lower layer includes a crack prevention layer containing In.

14. The nitride semiconductor laser device of claim 12, wherein said lower layer includes n-type dopant and said upper layer includes p-type dopant.

* * * * *

UNITED STATES PATENT AND TRADEMARK OFFICE
CERTIFICATE OF CORRECTION

PATENT NO.     : 6,617,607 B2
DATED          : September 9, 2003
INVENTOR(S)    : Shigetoshi Ito et al.

It is certified that error appears in the above-identified patent and that said Letters Patent is hereby corrected as shown below:

Column 12,
Line 5, please insert the words -- said light -- between the words "and emitting".
Line 5, please replae the word "wall" with -- well --

Signed and Sealed this

Fifteenth Day of June, 2004

JON W. DUDAS
*Acting Director of the United States Patent and Trademark Office*